(12) United States Patent
Kirby et al.

(10) Patent No.: US 8,753,981 B2
(45) Date of Patent: Jun. 17, 2014

(54) MICROELECTRONIC DEVICES WITH THROUGH-SILICON VIAS AND ASSOCIATED METHODS OF MANUFACTURING

(75) Inventors: Kyle K. Kirby, Eagle, ID (US); Kunal R. Parekh, Boise, ID (US); Philip J. Ireland, Nampa, ID (US); Sarah A. Niroumand, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/092,434

(22) Filed: Apr. 22, 2011

(65) Prior Publication Data

US 2012/0267786 A1    Oct. 25, 2012

(51) Int. Cl.
*H01L 21/44*    (2006.01)
*H01L 21/311*    (2006.01)

(52) U.S. Cl.
USPC ........... 438/672; 438/667; 438/689; 438/694; 438/695; 438/696

(58) Field of Classification Search
USPC ......... 438/629, 666, 667, 672, 675, 700, 689, 438/694, 695, 696
See application file for complete search history.

(56) References Cited

U.S. PATENT DOCUMENTS

| | | | |
|---|---|---|---|
| 6,399,512 B1 * | 6/2002 | Blosse et al. | 438/723 |
| 6,524,952 B1 * | 2/2003 | Srinivas et al. | 438/649 |
| 6,788,552 B1 * | 9/2004 | Jiang et al. | 361/818 |
| 7,338,585 B2 * | 3/2008 | Akolkar et al. | 205/118 |
| 7,687,137 B2 * | 3/2010 | Furuse et al. | 428/210 |
| 7,776,741 B2 | 8/2010 | Reid et al. | |
| 2002/0163072 A1 * | 11/2002 | Gupta et al. | 257/698 |
| 2009/0001598 A1 | 1/2009 | Chiou et al. | |
| 2009/0102021 A1 | 4/2009 | Chen et al. | |
| 2009/0160058 A1 | 6/2009 | Kuo et al. | |
| 2009/0224405 A1 | 9/2009 | Chiou et al. | |
| 2009/0315154 A1 * | 12/2009 | Kirby et al. | 257/621 |
| 2010/0140749 A1 | 6/2010 | Kuo | |
| 2010/0178766 A1 | 7/2010 | Andry et al. | |
| 2010/0182040 A1 | 7/2010 | Feng et al. | |
| 2010/0206737 A1 | 8/2010 | Preisser | |
| 2010/0244247 A1 * | 9/2010 | Chang et al. | 257/741 |
| 2010/0270597 A1 | 10/2010 | Sproch et al. | |
| 2010/0279503 A1 * | 11/2010 | Seidel et al. | 438/653 |

OTHER PUBLICATIONS

S.M. Sze. Semiconductor Devices. Physics and Technology. 2nd Edition, pp. 186-187.*

* cited by examiner

*Primary Examiner* — Cuong Q Nguyen
*Assistant Examiner* — Galina Yushina
(74) *Attorney, Agent, or Firm* — Perkins Coie LLP (57) ABSTRACT

Microelectronic devices with through-silicon vias and associated methods of manufacturing such devices. One embodiment of a method for forming tungsten through-silicon vias comprising forming an opening having a sidewall such that the opening extends through at least a portion of a substrate on which microelectronic structures have been formed. The method can further include lining the sidewall with a dielectric material, depositing tungsten on the dielectric material such that a cavity extends through at least a portion of the tungsten, and filling the cavity with a polysilicon material.

6 Claims, 13 Drawing Sheets

MICROELECTRONIC DEVICES WITH THROUGH-SILICON VIAS AND ASSOCIATED METHODS OF MANUFACTURING

TECHNICAL FIELD

The present technology is directed generally to microelectronic devices with through-silicon vias (TSVs) and associated methods of manufacturing TSVs.

BACKGROUND

Semiconductor dies typically include a plurality of integrated circuits, bond-pads coupled to the integrated circuits, and metal routing layers for routing electrical signals between the bond-pads and external contacts. Fabricating and packaging such semiconductor dies includes forming interconnects to electrically couple the bond-pads and/or metal routing layers to external devices (e.g., a lead frame, a printed circuit board, etc.).

In some applications, the interconnects extend through at least a significant portion of the semiconductor dies (commonly referred to as "through-silicon vias" or "TSVs"). In many cases, TSVs extend completely through the dies. One conventional process for forming TSVs can include forming deep vias on the front and/or back side of a die in alignment with corresponding bond-pads. The vias are then filled with a conductive material (e.g., copper). Solder balls and/or other external electrical contacts are subsequently attached to the TSVs.

Current copper TSVs, however, are difficult to manufacture and may limit the electrical performance of advanced microelectronic devices. High-performance microelectronic devices generally have a large number of TSVs in a small space such that the pitch between TSVs is very low. One concern of copper TSVs is that the difference between the coefficient of thermal expansion ("CTE") for silicon and the CTE for copper can lead to cracks that allow the copper to diffuse into the silicon. This may limit performance and is particularly problematic with small pitch sizes. Additionally, wafers are not being thinned as much as they were in the past to avoid breakage, and thus the vias for the TSVs need to be deeper. However, it is difficult to plate copper into such deeper vias, and therefore it is difficult to form copper TSVs in many types of devices.

Tungsten has been proposed as an alternative to copper for TSVs. However, fabricating tungsten TSVs at the production level has not been successfully implemented because it is impracticable to fill the large TSVs with tungsten and tungsten is not as conductive as copper. Therefore, tungsten is not known as a ready substitute for copper in forming TSVs.

DETAILED DESCRIPTION

Several embodiments of the present technology are described below with reference to devices with TSVs and processes for forming TSVs in semiconductor wafers or other microelectronic wafers. Many details of certain embodiments are described below with reference to semiconductor dies, but other types of dies that have TSVs are also included in the technology. The term "semiconductor substrate" is used throughout to include a variety of articles of manufacture, including, for example, individual integrated circuit dies, imager dies, sensor dies, solid state light emitting dies (e.g., light-emitting diodes (LEDs)), and/or dies comprising semiconductive material, including, but not limited to, bulk semiconductive materials such as a semiconductor wafer (either alone or in assemblies comprising other materials), and semiconductive material structures (either alone or in assemblies comprising other structures). The specific details of certain embodiments are set forth in FIGS. 1-24 and the following text to provide a thorough understanding of these embodiments. Several other embodiments can have configurations, components, and/or processes different from those described below. A person skilled in the relevant art, therefore, will appreciate that additional embodiments may be practiced without several of the details of the embodiments shown in FIGS. 1-24.

Figure 1:
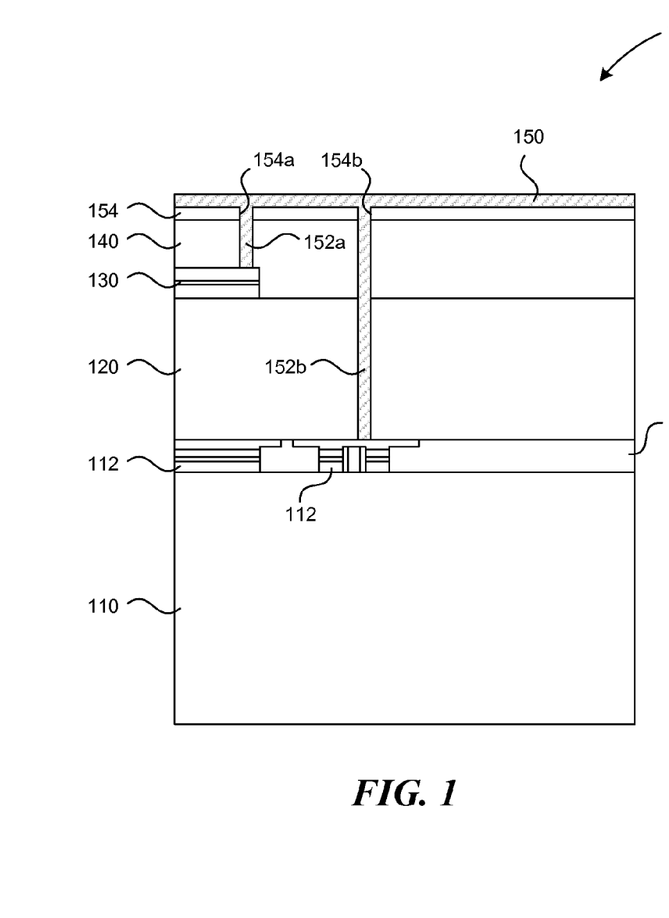
FIG. 1 is a schematic cross-sectional view illustrating a portion of a microelectronic wafer at one stage of a method of forming tungsten TSVs in accordance with an embodiment of the technology.

FIG. 1 is a schematic cross-sectional view of a portion of a microelectronic device wafer 100 at a stage of a method of forming tungsten TSVs in accordance with an embodiment of the technology. The wafer 100 can include a substrate 110, electrical components 112, a first interlayer dielectric structure 120 over the substrate 110, metallization 130 over the first interlayer dielectric structure 120, and a second interlayer dielectric structure 140 over the metallization 130 and the first interlayer dielectric structure 120. The substrate 110 can be a semiconductor substrate that includes silicon, gallium arsenide, silicon carbide, or another suitable semiconductor material or semiconductor compound. The substrate 110 can be non-semiconductive in other applications, such as a sapphire substrate used in LEDs. The electrical components 112 can be semiconductor components, such as transistors, other types of switches, light-emitting materials, or other semiconductor components commonly formed in integrated circuitry for memory devices, processors, sensors, solid state light-emitting dies and other types of microelectronic devices. The electrical components 112, for example, can have epitaxial structures in a stratum 114 that is either on or includes an upper portion of the substrate 110.

The first and second interlayer dielectric structures 120 and 140 can comprise one or more of many different materials. For example, the first and second interlayer dielectric structures 120 and 140 can comprise low dielectric constant materials, oxides, glasses, or other types of materials commonly used to electrically isolate the multiple layers of electrical components and metallization in a microelectronic wafer. The first and second interlayer dielectric structures 120 and 140 can be composed of the same material or different materials.

The wafer 100 illustrated in FIG. 1 is shown after a conductive material 150 has been deposited to form first contacts 152a connected to the metallization 130 and second contacts 152b connected to the electrical components 112. The contacts 152a-b (collectively referred to as "contacts 152") can be formed by patterning a hard mask 154 to have first openings 154a and second openings 154b corresponding to the locations of the metallization 130 and electrical components 112, respectively. The conductive material 150 is then deposited into the openings 154a and 154b to form the contacts 152. The conductive material 150 can be tungsten deposited using vapor deposition techniques or other suitable processes.

Figure 2:
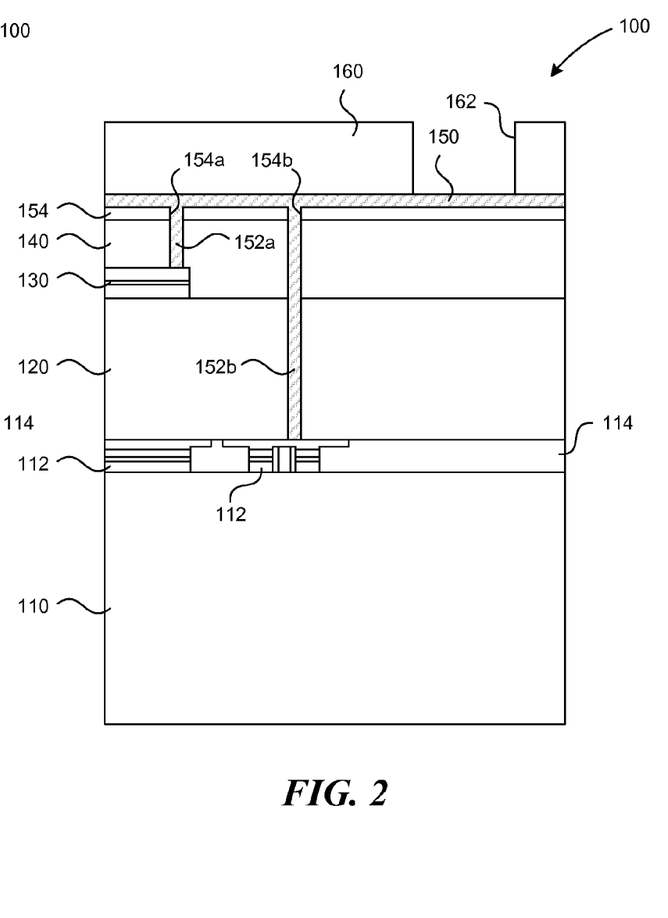
FIG. 2 is a schematic cross-sectional view of the portion of the microelectronic wafer at a subsequent stage of the method of forming tungsten TSVs in accordance with the technology.
Figures 3, 4:
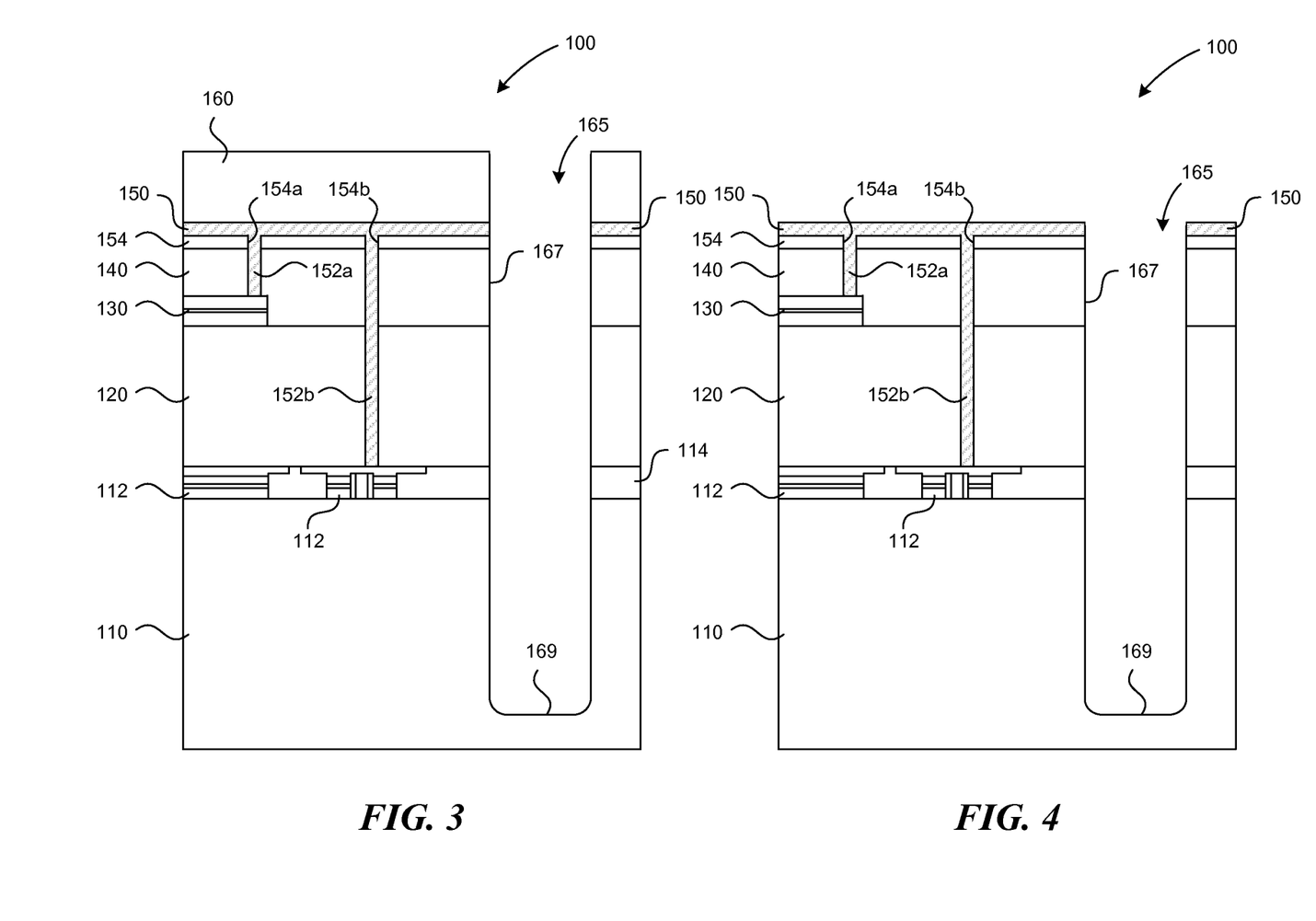
FIG. 3 is a schematic cross-sectional view of the portion of the microelectronic wafer at a subsequent stage of the method of forming tungsten TSVs in accordance with the technology.
FIG. 4 is a schematic cross-sectional view of the portion of the microelectronic wafer at a subsequent stage of the method of forming tungsten TSVs in accordance with the technology.

FIGS. 2-4 illustrate forming an opening through the second interlayer structure 140, the first interlayer dielectric structure 120, and at least a portion of the substrate 110. Referring to FIG. 2, a photo-sensitive material 160 is deposited onto the top of the conductive material 150. The photo-sensitive material 160 can be a resist or other type of material used in photolithography processes. The photosensitive material 160 is then patterned and developed to form one or more openings 162 corresponding to locations for forming the openings.

FIG. 3 illustrates a stage of the method after an opening 165 has been formed through the conductive material 150, second interlayer dielectric structure 140, first interlayer dielectric structure 120, and a portion of the substrate 110. The opening 165 can be formed using one or more processes, such as etching and/or laser drilling, that remove the materials in a controlled manner. For example, several different etches can be used to etch through the individual materials of the wafer 100. The opening 165 can have a sidewall 167 that extends completely through the first and second interlayer dielectric structures 120 and 140, but through only a portion of the thickness of the substrate 110, such that the opening 165 has a closed end 169 within the substrate 110. In other embodiments, the opening 165 can be formed to extend completely through the substrate 110. The opening 165 can have a number of different cross-sectional shapes. For example, the opening 165 can be cylindrical such that it has a single sidewall 167, or the opening 165 can be rectilinear or another cross-sectional shape that has one or more sidewalls 167. FIG. 4 illustrates a stage after the photosensitive material 160 has been removed from the wafer 100 to expose the top surface of the conductive material 150.

In one specific embodiment, which is not intended to limit the scope of the technology, the first interlayer dielectric structure 120 comprises phosphorus silica glass ("PSG"), the second interlayer dielectric structure 140 comprises boron phosphorus silica glass ("BPSG"), and the hard mask comprises tetraethyl orthosilicate ("TEOS"). The opening 165 can be formed using a single etchant that etches through the conductive material 150, TEOS of the hard mask 154, BPSG of the second interlayer dielectric structure 140, PSG of the first interlayer dielectric structure 120, dielectric stratum 114, and substrate 110. In other embodiments, a number of different etchants can be used to selectively etch through one or more of the conductive materials, interlayer dielectric structures, and the substrate. Suitable etches for forming the opening 165 are known to those skilled in the art.

Figure 5:
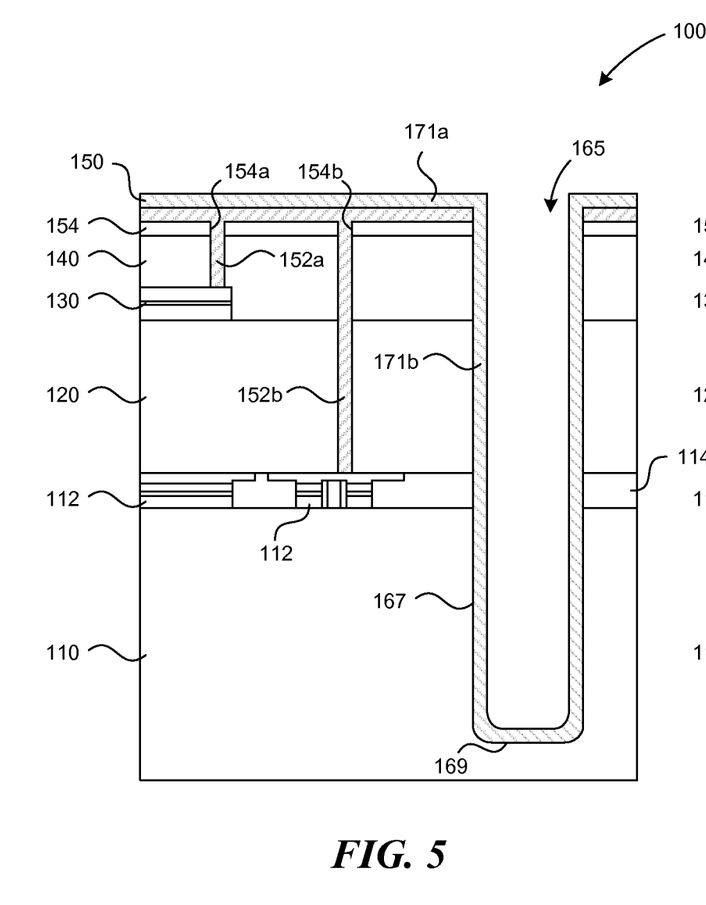
FIG. 5 is a schematic cross-sectional view of the portion of the microelectronic wafer at a subsequent stage of the method of forming tungsten TSVs in accordance with the technology.
Figure 6:
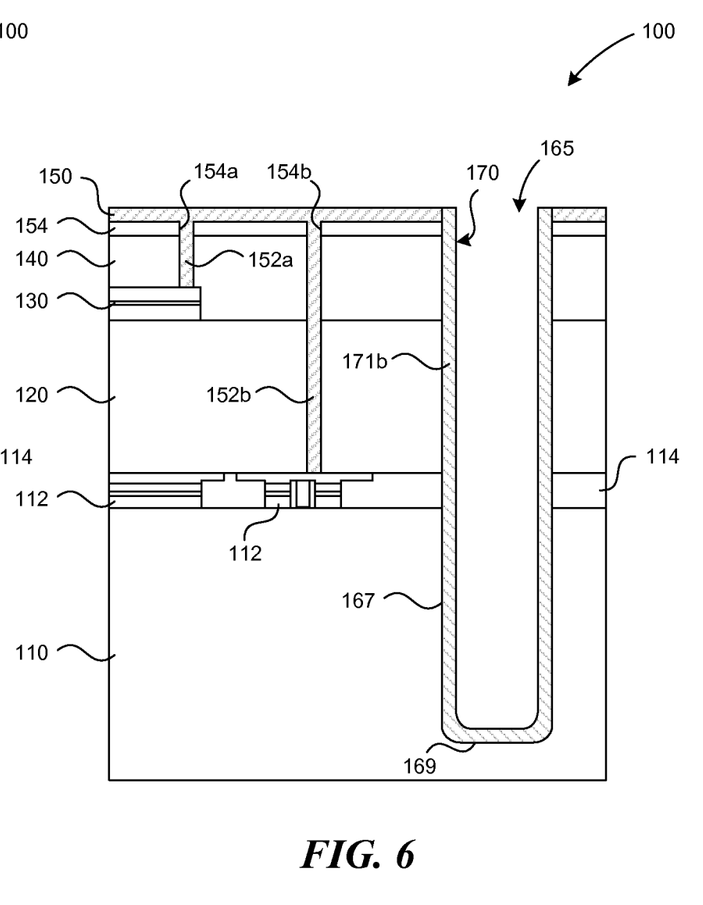
FIG. 6 is a schematic cross-sectional view of the portion of the microelectronic wafer at a subsequent stage of the method of forming tungsten TSVs in accordance with the technology.

FIGS. 5 and 6 illustrate forming a dielectric liner along the sidewall 167 of the opening 165. Referring to FIG. 5, the dielectric liner can be formed by depositing a dielectric material over the second interlayer dielectric structure 140 and into the opening 165 along the sidewall 167 and over the closed end 169. The dielectric material, for example, can have a first portion 171a on top of the conductive material 150 and a second portion 171b in the opening 165.

FIG. 6 illustrates a stage of the method after the first portion 171a of the dielectric material has been removed from the conductive material 150 such that the second portion 171b of the dielectric material remains in the opening 165 and forms a dielectric liner 170 along the sidewall 167 of the opening 165. The dielectric liner 170 can comprise an oxide, such as silicon oxide, that is grown or otherwise deposited onto the conductive material 150 and into the opening 165. The first portion 171a of the dielectric material can be removed using a spacer etch that preferentially removes material normal to the direction of the etchant, as known in the art. Although not shown in FIG. 6, the spacer etch will also remove some or all of the material from the second portion 171b at the closed end 169 of the opening 165. However, this portion of the substrate 110 is removed at the end of the process, so it is not critical whether the second portion 171b of dielectric material is removed from the closed end of the opening 165.

Figure 7:
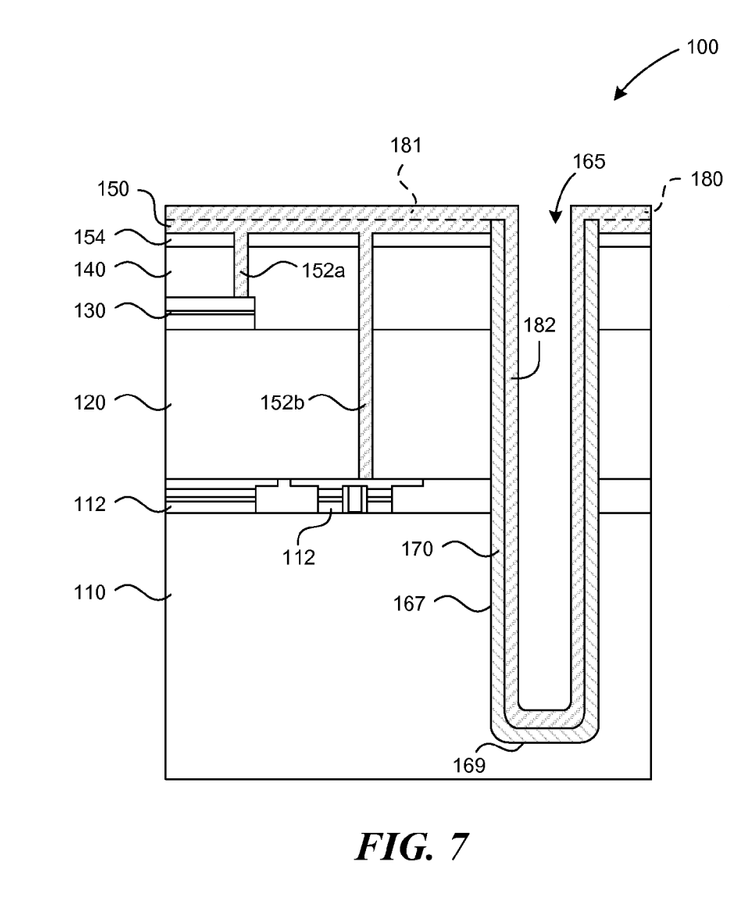
FIG. 7 is a schematic cross-sectional view of the portion of the microelectronic wafer at a subsequent stage of the method of forming tungsten TSVs in accordance with the technology.

Referring to FIG. 7, tungsten 180 is deposited onto the wafer 100. The tungsten 180 can be deposited using a vapor deposition technique, such as chemical-vapor deposition ("CVD"), for example. The tungsten 180 can have a first portion 181 deposited onto the conductive material 150 and a second portion 182 deposited into the opening 165 such that the second portion 182 of tungsten conforms to the dielectric liner 170. When the conductive material 150 is also tungsten, the first portion 181 of tungsten 180 and the portion of conductive material 150 on the mask 154 form a contiguous portion of tungsten 150/180 over the mask 154 and second interlayer dielectric structure 140. The second portion 182 of tungsten 180 can define a tungsten conductor along the dielectric liner.

Figure 8:
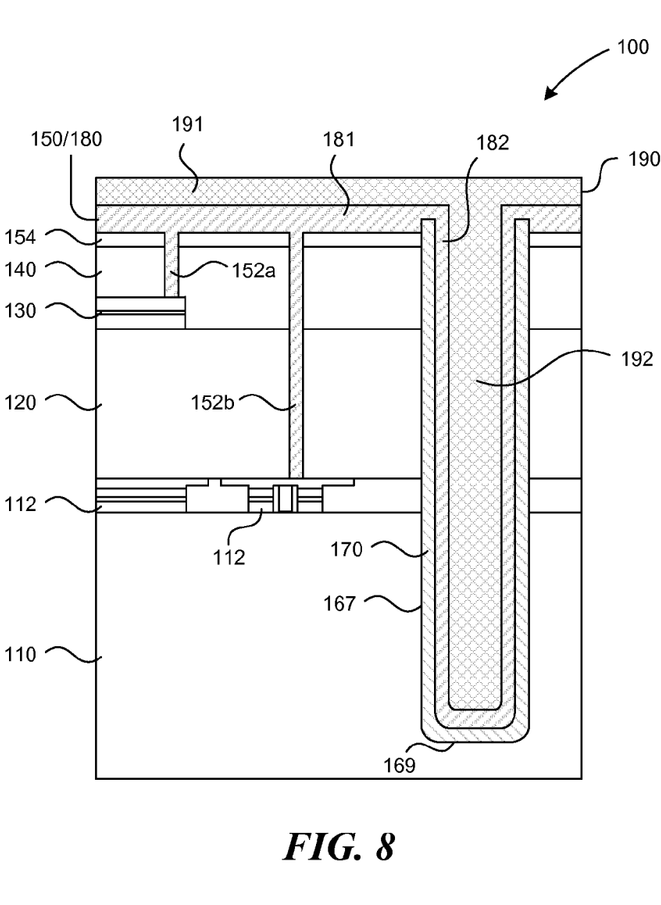
FIG. 8 is a schematic cross-sectional view of the portion of the microelectronic wafer at a subsequent stage of the method of forming tungsten TSVs in accordance with the technology.

FIG. 8 illustrates a subsequent stage of a method after a polysilicon 190 has been deposited onto the wafer 100 and into at least a portion of opening 165. The polysilicon 190 has a first portion 191 on the first portion 181 of the tungsten 180 and a second portion 192 that can fill the opening 165 (FIG. 7) in the second portion 182 of the tungsten 180. The polysilicon 190 can be deposited using vapor deposition or other suitable processes.

Figures 9, 10:
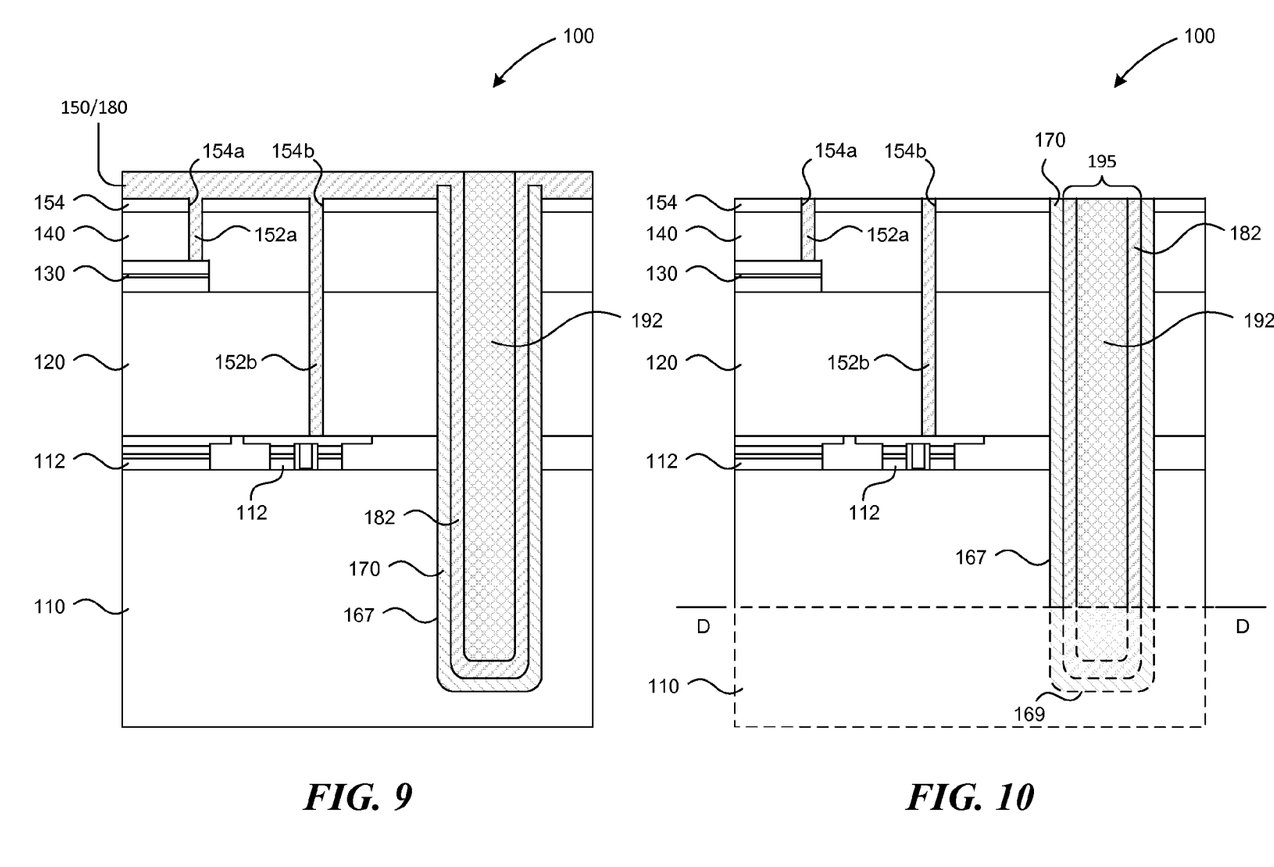
FIG. 9 is a schematic cross-sectional view of the portion of the microelectronic wafer at a subsequent stage of the method of forming tungsten TSVs in accordance with the technology.
FIG. 10 is a schematic cross-sectional view of the portion of the microelectronic wafer at a subsequent stage of the method of forming tungsten TSVs in accordance with the technology.

FIG. 9 illustrates a subsequent stage after the first portion 191 of the polysilicon 190 has been removed. The first portion 191 of the polysilicon 190 can be removed in a two-step process that includes a wet polysilicon etch followed by a polysilicon chemical-mechanical planarization process.

FIG. 10 illustrates a subsequent stage after the tungsten 180, polysilicon 190, and top portion of the dielectric liner 170 have been removed to the level of the mask 154 to electrically isolate the second portion 182 of tungsten 180 and the second portion 192 of polysilicon 190 within the dielectric liner 170. The second portion 182 of tungsten 180 and the second portion 192 of polysilicon 190 define a tungsten TSV 195. The opposite end of the tungsten TSV 195 can be exposed by removing material from the backside of the substrate 110 to an intermediate depth D-D using a mechanical, chemical or chemical-mechanical process.

Figure 11:
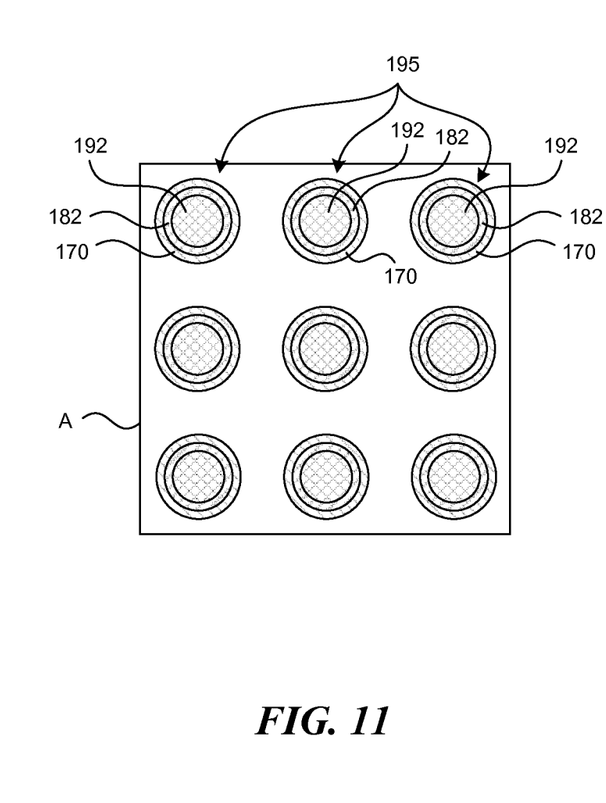
FIG. 11 is a top plan view of an array of tungsten TSVs formed using an embodiment of the method illustrated in FIGS. 1-10.
Figure 12:
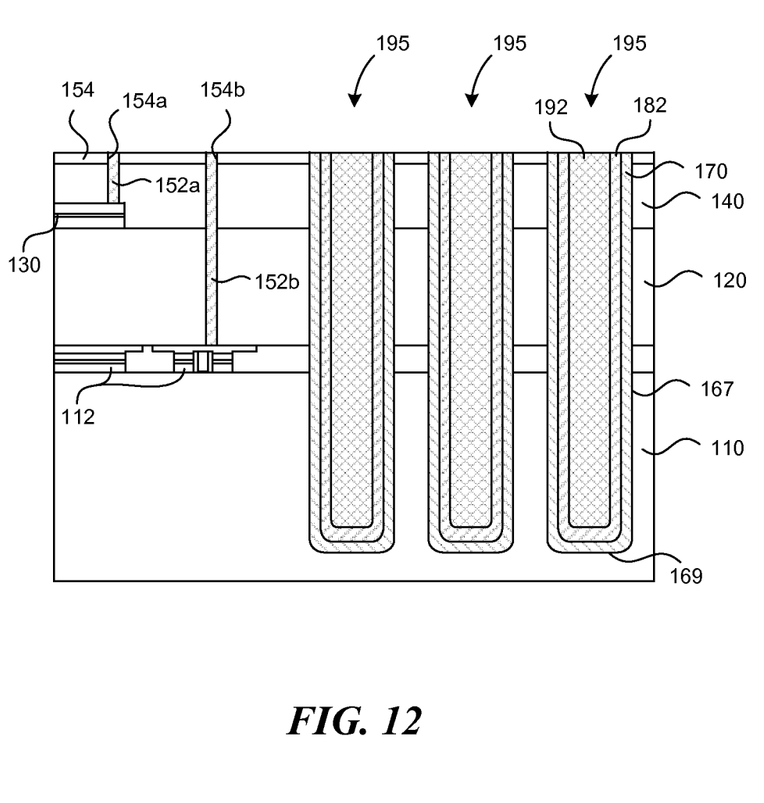
FIG. 12 is a schematic cross-sectional view of a portion of a microelectronic device having an array of tungsten TSVs in accordance with an embodiment of the technology.

FIGS. 11 and 12 illustrate one embodiment in which a plurality of tungsten TSVs 195 are formed in the general space occupied by a single copper TSV in a conventional copper application. FIG. 11, for example, is a top plan view of an array of tungsten TSVs 195 formed within an area A in which a single copper interconnect would normally be formed in conventional applications. In the illustrated example, nine tungsten TSVs 195 are arranged in a 3×3 array, but other embodiments can have any number of tungsten TSVs formed in other arrays. FIG. 12 is a cross-sectional view illustrating the array of tungsten TSVs 195 of FIG. 11 within the wafer 100 in accordance with an embodiment of the technology.

FIGS. 13-22 illustrate a method for forming tungsten TSVs in accordance with another embodiment of the technology.

Figure 13:
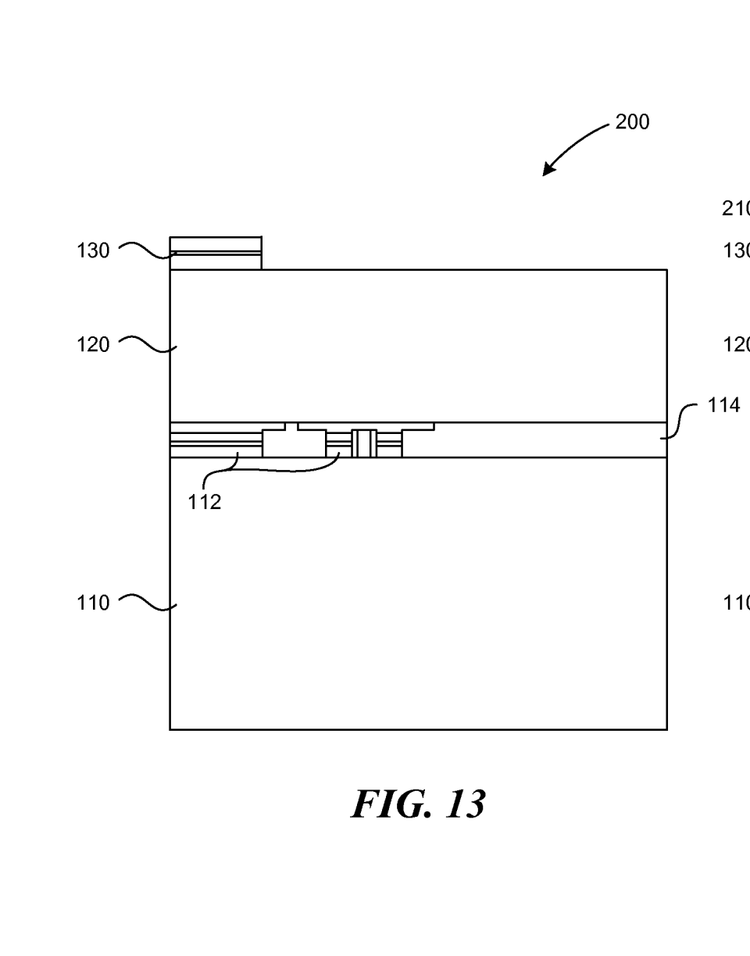
FIG. 13 is a schematic cross-sectional view of a portion of a microelectronic wafer at a stage of forming tungsten TSVs in accordance with another embodiment of the technology.

Like reference numbers refer to at least generally similar components in FIGS. 1-22. FIG. 13 is a schematic cross-sectional view of a portion of a microelectronic wafer 200 having the substrate 110, electrical components 112, the first interlayer dielectric structure 120, and the metallization 130 over the first interlayer dielectric structure 120.

Figure 14:
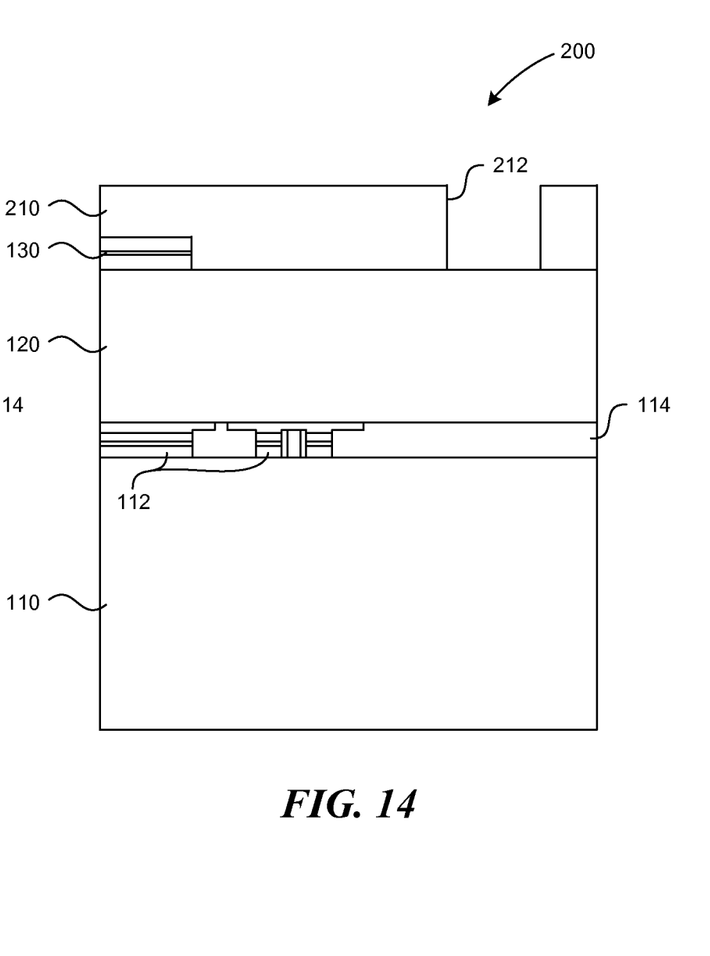
FIG. 14 is a schematic cross-sectional view of the portion of the microelectronic wafer at a subsequent stage of the method of forming tungsten TSVs in accordance with the technology.
Figure 15:
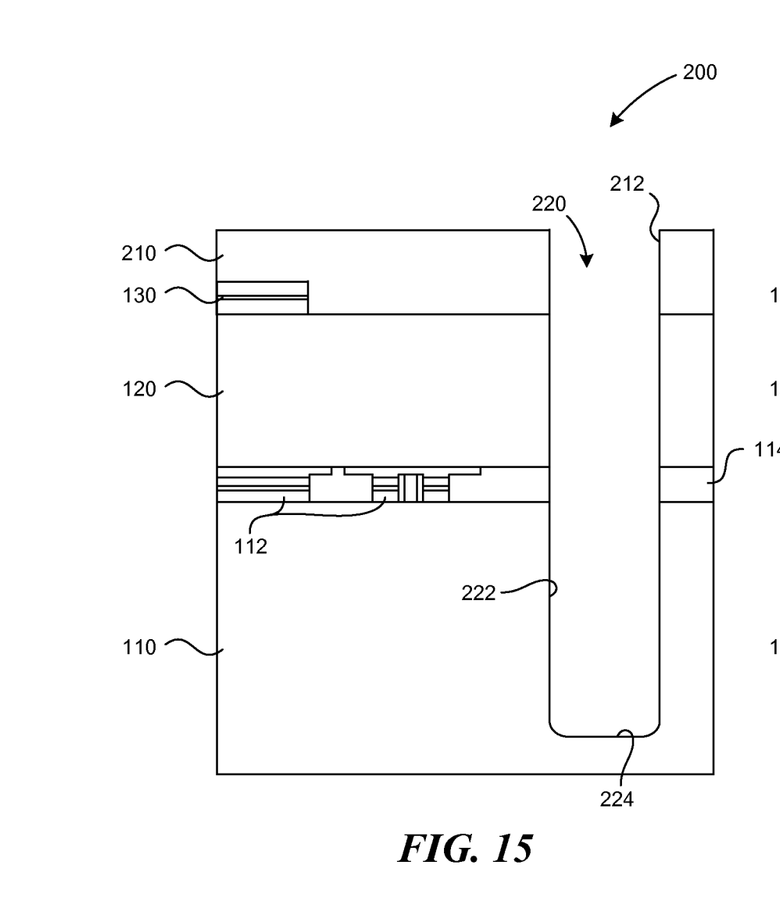
FIG. 15 is a schematic cross-sectional view of the portion of the microelectronic wafer at a subsequent stage of the method of forming tungsten TSVs in accordance with the technology.
Figure 16:
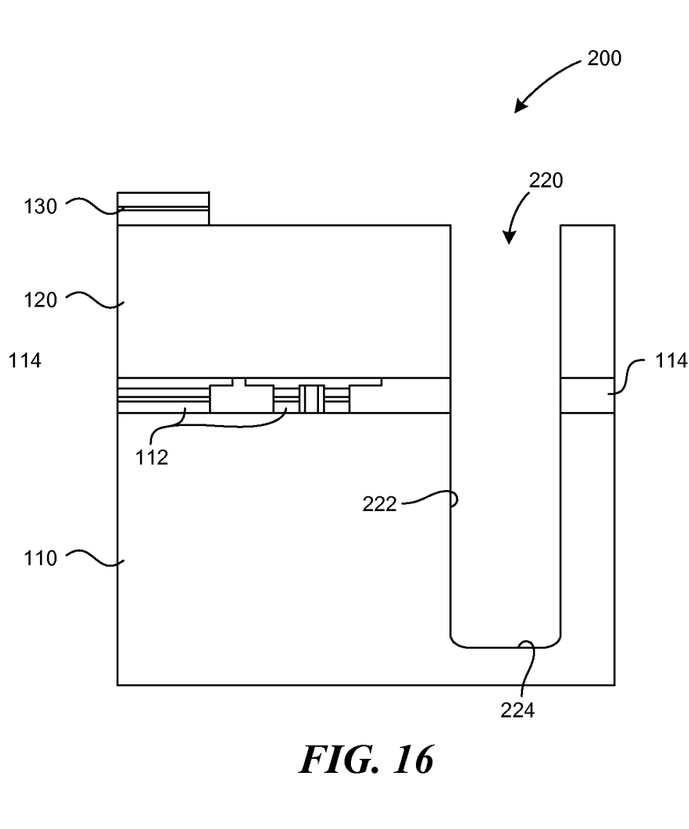
FIG. 16 is a schematic cross-sectional view of the portion of the microelectronic wafer at a subsequent stage of the method of forming tungsten TSVs in accordance with the technology.

FIGS. 14-16 illustrate stages of forming a opening through the first interlayer dielectric structure 120 and at least a portion of the substrate 110. FIG. 14 shows a stage of a process after a photo-sensitive material 210 has been deposited onto the top of the first interlayer dielectric structure 120 and over the metallization 130. The photo-sensitive material 210 can be a resist or other type of material commonly used in photolithography processes. The photo-sensitive material 210 is then patterned and developed to form one or more openings 212 corresponding to the locations where openings are to be formed.

FIG. 15 illustrates a subsequent stage after a opening 220 has been formed through the first interlayer dielectric structure 120 and at least a portion of the substrate 110. The opening 220 can have a sidewall 222 that extends completely through the first interlayer dielectric structure 120, but only through a portion of the thickness of the substrate 110 such that the opening 220 has a closed end 224 within the substrate 110. In other embodiments, the opening 220 can be formed to extend completely though the substrate 110. As with the opening 165 shown in FIG. 3, the opening 220 can have a number different cross-sectional shapes and configurations. FIG. 16 illustrates a stage of the method after the photo-sensitive material 210 has been removed from the wafer 200 to expose the first interlayer dielectric structure 120 and the metallization 130.

Figure 17:
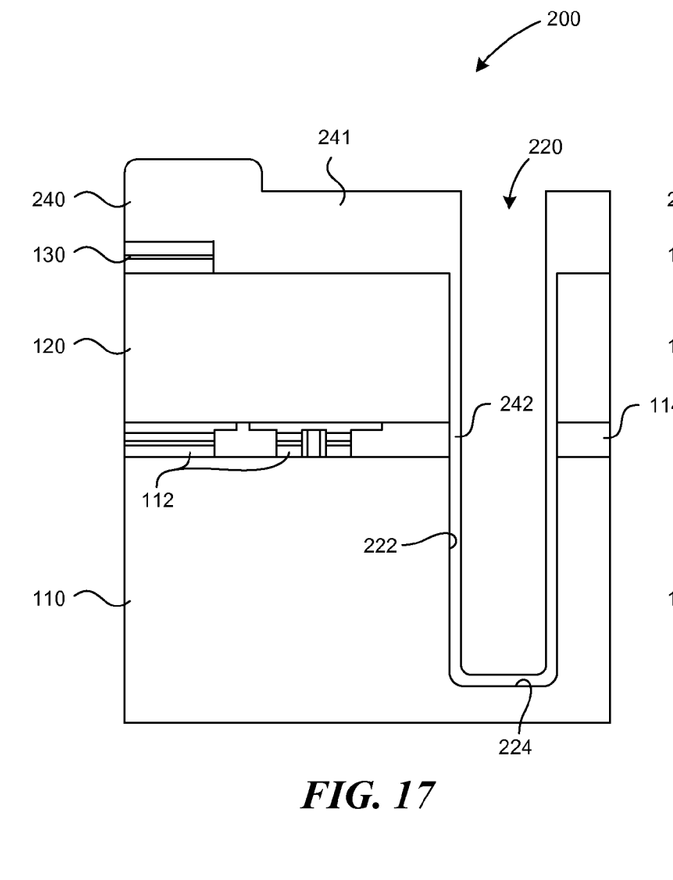
FIG. 17 is a schematic cross-sectional view of the portion of the microelectronic wafer at a subsequent stage of the method of forming tungsten TSVs in accordance with the technology.

FIG. 17 illustrates a subsequent stage of an embodiment of a method after a second interlayer dielectric structure 240 has been formed and the dielectric material for a dielectric liner has been deposited into the opening 220. The second dielectric structure 240 and the material for the dielectric liner can be formed in a single process using the same material (e.g., BPSG). For example, a first portion 241 of such a material can define the second interlayer dielectric structure 240 and a second portion 242 of the same material can extend along the sidewall 222 of the opening 220 and define a dielectric liner (herein after identified a dielectric liner 242). The dielectric liner 242 can also cover the closed end 224 of the opening 220.

Figure 18:
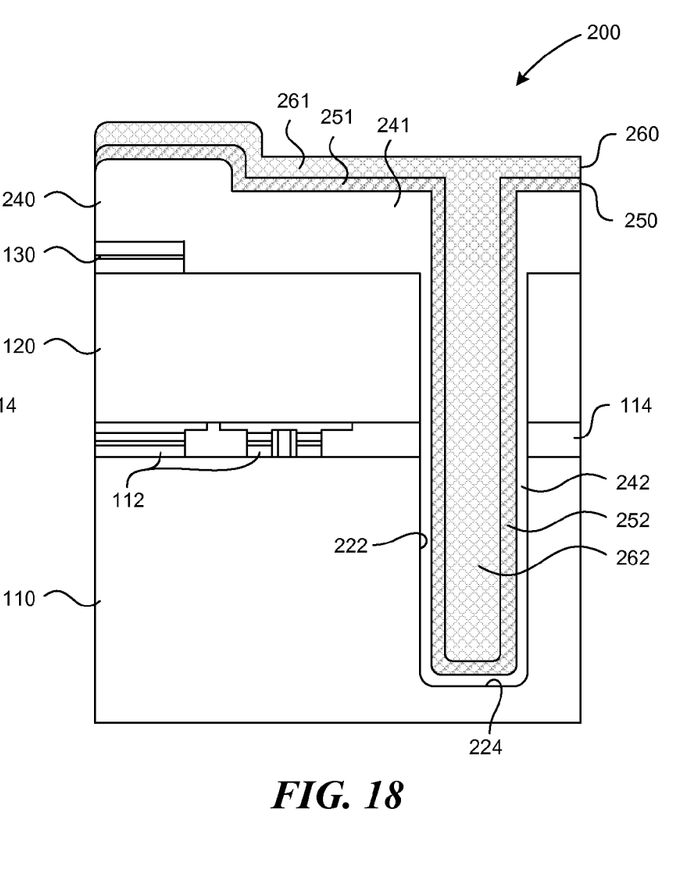
FIG. 18 is a schematic cross-sectional view of the portion of the microelectronic wafer at a subsequent stage of the method of forming tungsten TSVs in accordance with the technology.

FIG. 18 illustrates a subsequent stage of an embodiment of the method after tungsten 250 and polysilicon 260 have been deposited onto the wafer 200 to fill the opening 220 (FIG. 17). The tungsten 250 can include a first portion 251 on the second interlayer dielectric structure 240, and the polysilicon 260 can include a first portion 261 on the first portion 251 of the tungsten 250. The tungsten 250 can also include a second portion 252 extending into the opening 220 (FIG. 17). Accordingly, as with the second portion 182 of tungsten 180 (FIGS. 7-10), the second portion 252 of tungsten 250 forms a tungsten conductor along the dielectric liner 242 such that a cavity (not shown in FIG. 18) extends into the tungsten conductor before the polysilicon 260 is deposited. The polysilicon 260 accordingly includes a second portion 262 deposited into the cavity of the tungsten conductor defined by the second portion 252 of the tungsten 250.

Figure 19:
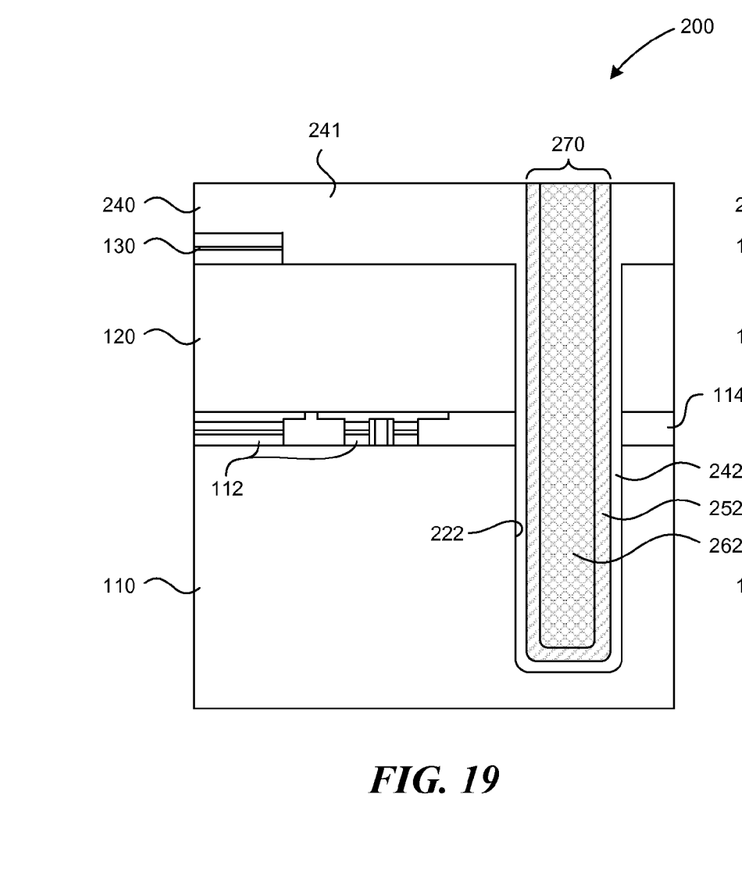
FIG. 19 is a schematic cross-sectional view of the portion of the microelectronic wafer at a subsequent stage of the method of forming tungsten TSVs in accordance with the technology.

FIG. 19 illustrates a subsequent stage of an embodiment of the method after the first portion 251 of tungsten 250 and the first portion 261 of polysilicon 260 have been removed to form a tungsten TSV 270. The first portions 251 and 261 of tungsten 250 and polysilicon 260, respectively, can be removed using chemical-mechanical planarization, grinding, or other suitable processes. In the embodiment illustrated in FIG. 19, the planarization process proceeds until a planar surface is formed on the interlayer dielectric portion 241.

Figure 20:
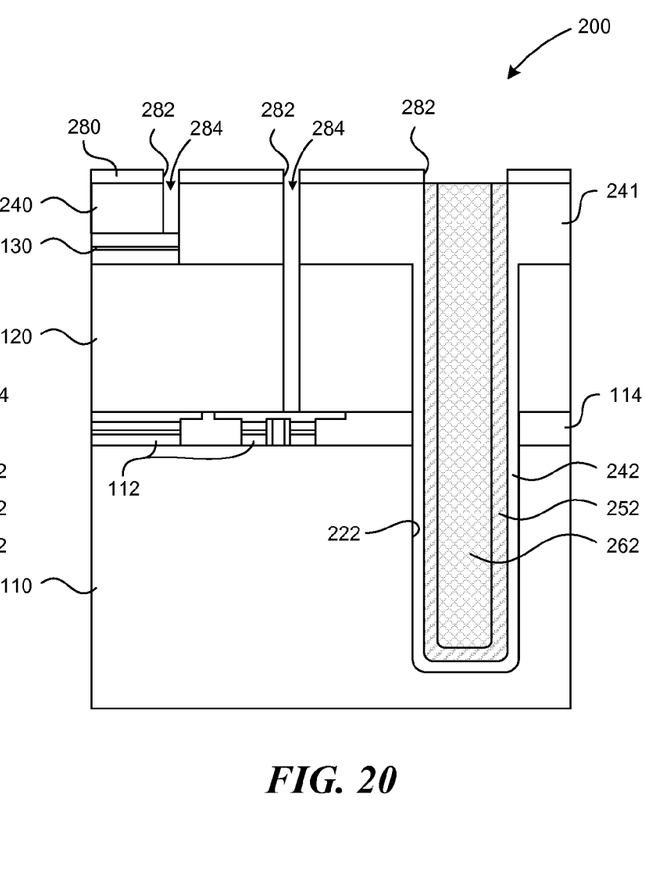
FIG. 20 is a schematic cross-sectional view of the portion of the microelectronic wafer at a subsequent stage of the method of forming tungsten TSVs in accordance with the technology.

FIG. 20 illustrates a subsequent stage of an embodiment of the method after a hard mask 280 has been formed to have a plurality of openings 282. The openings 282 are formed at locations where additional tungsten is to be deposited. In one embodiment, vias 284 can be etched through the first interlayer dielectric structure 120 and/or the second interlayer dielectric structure 240 to the electrical components 112 and/or the metallization 130.

Figure 21:
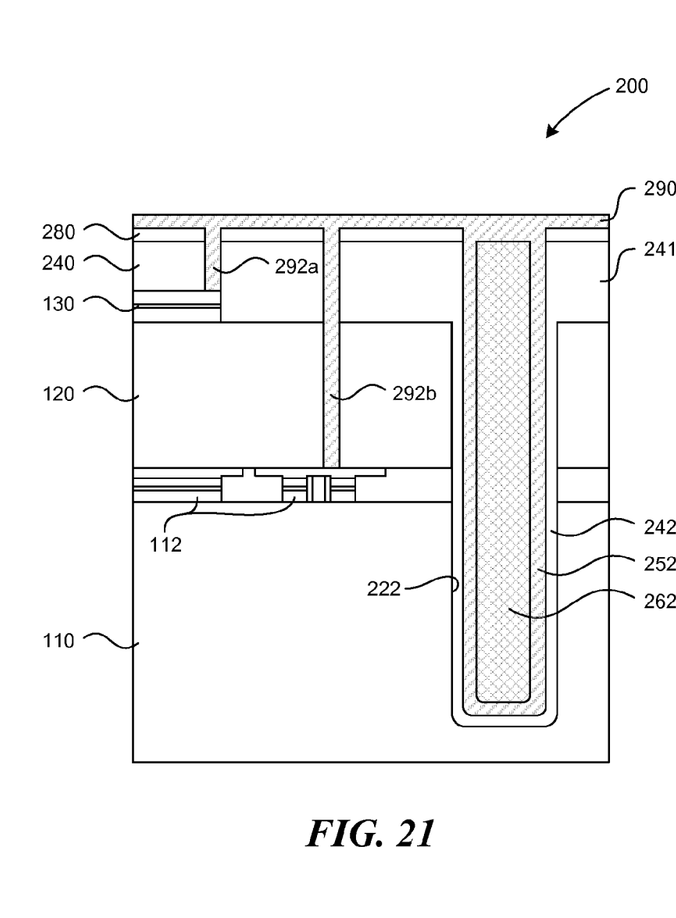
FIG. 21 is a schematic cross-sectional view of the portion of the microelectronic wafer at a subsequent stage of the method of forming tungsten TSVs in accordance with the technology.
Figure 22:
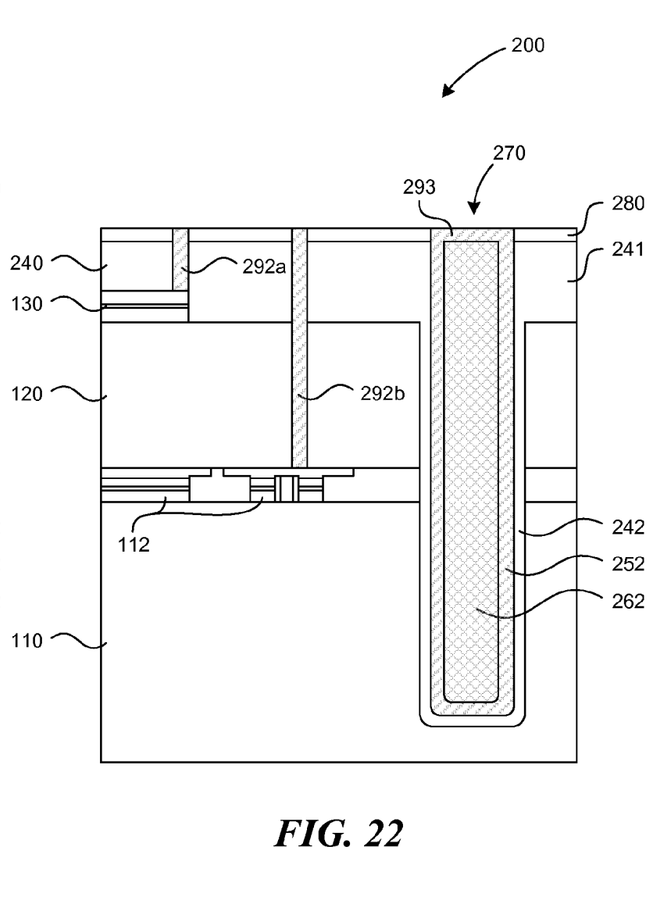
FIG. 22 is a schematic cross-sectional view of the portion of the microelectronic wafer at a subsequent stage of the method of forming tungsten TSVs in accordance with the technology.

FIGS. 21 and 22 illustrate subsequent stages of an embodiment of the method. FIG. 21 illustrates a stage after which additional tungsten 290 has been deposited into the openings 282. The portion of the additional tungsten 290 forms first and second contacts 292a-b that are electrically coupled to the metallization 130 and the electrical components 112, respectively. Another portion of the additional tungsten 290 covers the second portion 252 of the original tungsten and a second portion 262 of the polysilicon. FIG. 22 illustrates a subsequent stage after the excess portion of additional tungsten 290 on top of the hard mask 280 has been removed using chemical-mechanical planarization or another suitable process. As shown in FIG. 22, the tungsten TSV 270 includes the second portion 252 of the original tungsten, the second portion 262 of the polysilicon, and a top portion 293 of the additional polysilicon 290 (FIG. 21). The tungsten TSV 270 can be arranged in an array similar to the array of tungsten TSVs 195 illustrated in FIGS. 11 and 12.

Figure 23:
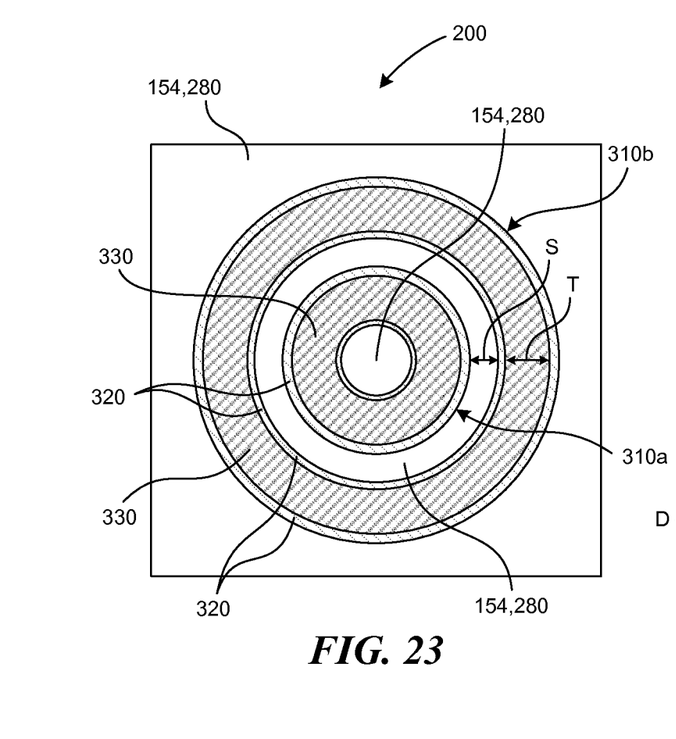
FIG. 23 is a top plan view of an array of tungsten TSVs in accordance with another embodiment of the technology.
Figure 24:
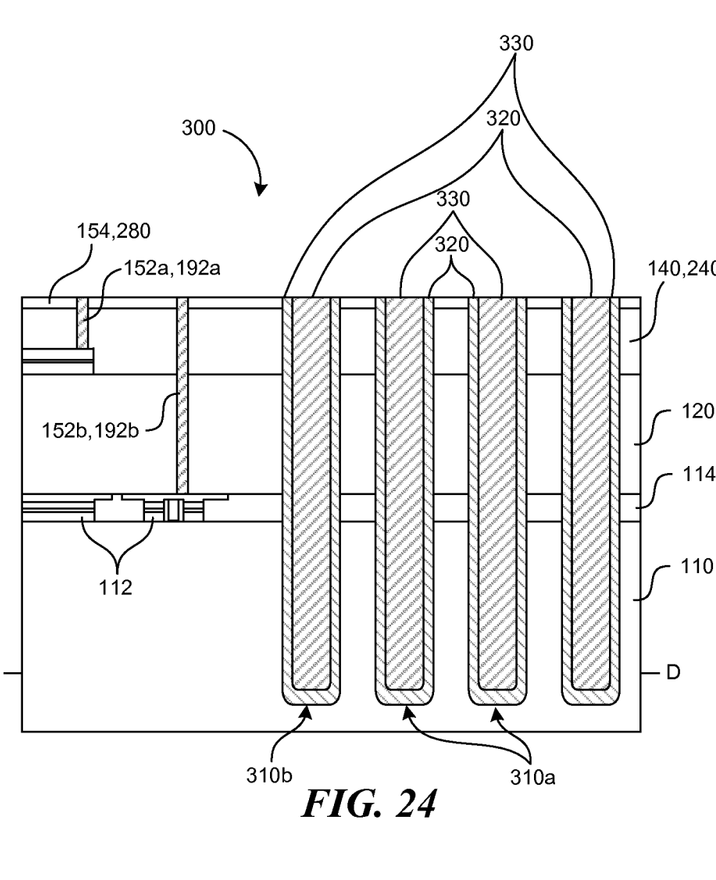
FIG. 24 is a schematic cross-sectional view of a portion of a microelectronic wafer having the array of tungsten TSVs shown in FIG. 23.

FIG. 23 is a top view and FIG. 24 is a cross-sectional view of a portion of a wafer 300 in accordance with another embodiment of the technology, and like reference numbers refer to at least generally similar components in FIGS. 1-24. The wafer 300 can have an array of tungsten TSVs 310 (identified individually as a first tungsten TSV 310a and a second tungsten TSV 310b). The tungsten TSVs 310 can be concentric elements having a cylindrical, rectilinear or other shape. For example, the tungsten TSVs 310 shown in FIG. 23 are cylindrical, but they could alternatively be squares, rectangles, oval, elliptical or other shapes when viewed from the top. The tungsten TSVs 310 can be constructed by (a) forming concentrically arranged openings in a manner similar to forming the openings 120 or 220 described above, (b) forming dielectric liners 320 in a manner similar to the dielectric liners 170 and 242 described above, and (c) filling the cavity between the liners 320 with tungsten 330. The tungsten 330 can have a thickness T of about 1-5 µm, and the dielectric liners 320 between the first and second tungsten TSVs 310a-b can be about 1-10 µm. In a specific embodiment not intended to be limiting, the thickness T of the tungsten 330 can be about 3 µm and the spacing S between the TSVs 310a-b can be about 3 µm.

Figure 25:
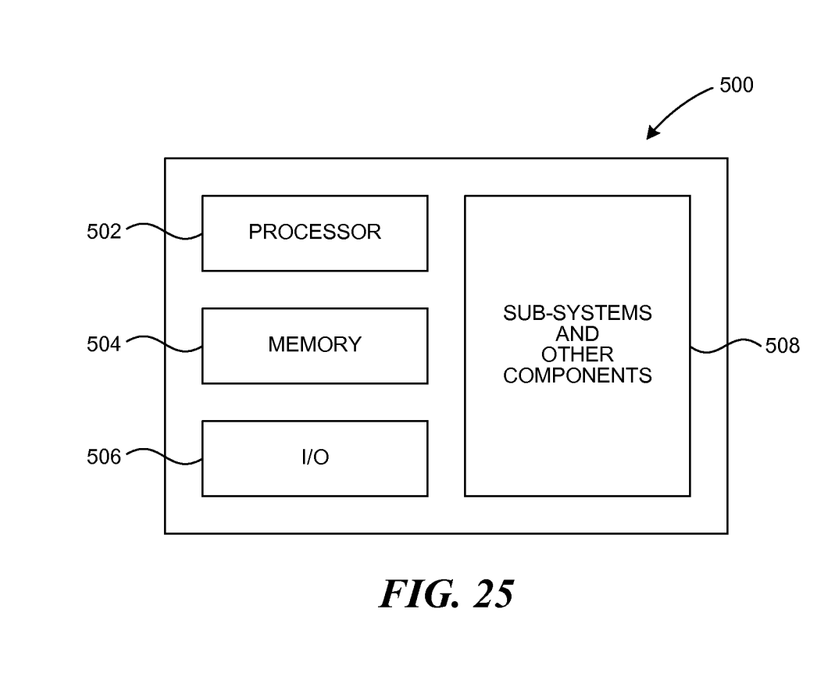
FIG. 25 is a schematic diagram of a system including a microelectronic device having a tungsten TSV in accordance with the technology.

Any one of the assemblies having the features described above with reference to FIGS. 1-24 can be incorporated into any of a myriad of larger and/or more complex systems, a representative example of which is system 500 shown schematically in FIG. 25. The system 500 can include a processor 502, a memory 504 (e.g., SRAM, DRAM, flash, and/or other memory devices), input/output devices 506, and/or other subsystems or components 508. The assemblies having tungsten TSVs described above with reference to FIGS. 1-24 may be included in any of the components shown in FIG. 25. The resulting system 500 can perform any of a wide variety of computing, processing, storage, sensing, imaging, and/or other functions. Accordingly, representative systems 500 include, without limitation, computers and/or other data processors, for example, desktop computers, laptop computers, Internet appliances, hand-held devices (e.g., palm-top computers, wearable computers, cellular or mobile phones, personal digital assistants, music players, etc.), tablets, multiprocessor systems, processor-based or programmable consumer electronics, network computers, and minicomputers. Additional systems include lights, cameras, vehicles, etc. Other representative systems 500 may be housed in a single unit or distributed over multiple interconnected units (e.g., through a communication network). The components of the system 500 can accordingly include local and/or remote memory storage devices and any of a wide variety of computer-readable media.

From the foregoing, it will be appreciated that specific embodiments of the invention have been described herein for purposes of illustration, but that various modifications may be made without deviating from the spirit and scope of the invention. Accordingly, the invention is not limited except as by the appended claims.

We claim:

1. A method for forming tungsten through-silicon vias in a wafer having a semiconductor substrate, a first interlayer dielectric structure over the semiconductor substrate, a metallization structure on the first interlayer dielectric structure, a second interlayer dielectric structure over the first interlayer dielectric structure, and semiconductor components, the method comprising:
   forming a first opening through the second interlayer dielectric structure to the metallization structure on the first interlayer dielectric structure;
   forming a second opening through the second interlayer dielectric structure and the first interlayer dielectric structure to one of the semiconductor components;
   filling the first and second openings with a conductive material, wherein the conductive material in the second opening forms a conductive contact;
   forming a via opening by etching completely through the second interlayer dielectric structure, completely through the first interlayer dielectric structure, and through only a portion of the semiconductor substrate such that the via opening has a sidewall extending through at least a portion of the semiconductor substrate and a closed end in the semiconductor substrate, wherein the via opening is spaced laterally apart from the conductive contact that is electrically coupled to the one of the semiconductor components;
   forming a dielectric liner along the sidewall of the via opening by depositing a first portion of a dielectric material over the second interlayer dielectric structure and a second portion of the dielectric material into the via opening, and removing the first portion of the dielectric material from the second interlayer dielectric structure such that the second portion of the dielectric material lines the sidewall of the opening and defines the dielectric liner;
   forming a tungsten conductor along the dielectric liner by depositing (a) a first portion of the tungsten over the second interlayer dielectric structure such that the first portion of tungsten is in electrical contact with conductive material associated with the conductive contact and (b) a second portion of tungsten defines the tungsten into the via opening such that the second portion of tungsten conforms to the dielectric liner in the via opening and partially fills the via opening, wherein the second portion of tungsten defines the tungsten conductor and a cavity extends into the tungsten conductor;

depositing a first portion of polysilicon on the first portion of the tungsten and a second portion of polysilicon that fills the cavity in the tungsten conductor;

removing the first portion of polysilicon and the first portion of tungsten such that the tungsten conductor is electrically isolated from the conductive contact.

2. The method of claim 1, further comprising removing material from a backside of the semiconductor substrate until the tungsten conductor and polysilicon are exposed.

3. The method of claim 1, wherein the conductive contact and the tungsten conductor have coplanar upper surfaces after removing the first portion of tungsten.

4. A method for forming tungsten through-silicon vias in a wafer having a semiconductor substrate, a first interlayer dielectric structure over the semiconductor substrate, a metallization structure on the first interlayer dielectric structure, a second interlayer dielectric structure over the first interlayer dielectric structure, and semiconductor components, the method comprising:

forming a first opening through the second interlayer dielectric structure to the metallization structure on the first interlayer dielectric structure;

forming a second opening through the second interlayer dielectric structure and the first interlayer dielectric structure to one of the semiconductor components;

filling the first and second openings with a conductive material, wherein the conductive material in the second opening forms a conductive contact;

forming a via opening having a sidewall such that the via opening is spaced laterally apart from the conductive contact that is electrically coupled to the one of the semiconductor components, wherein the via opening is etched completely through the second interlayer dielectric structure, completely through the first interlayer dielectric structure, and through only a portion of the semiconductor substrate such that the via opening has a closed end in the semiconductor substrate;

lining the sidewall with a dielectric material by depositing a first portion of the dielectric material over the second interlayer dielectric structure and a second portion of the dielectric material into the via opening, and removing the first portion of the dielectric material from the second interlayer dielectric structure such that the second portion of the dielectric material lines the sidewall of the via opening and defines a dielectric liner;

depositing tungsten on the dielectric material such that a first portion of the tungsten is deposited over the second interlayer dielectric structure and contacts conductive material associated with the conductive contact, a second portion of the tungsten is deposited into the via opening such that the second portion of the tungsten conforms to the second portion of the dielectric material lining the sidewall of the via opening and is conductively coupled to the conductive contact, and a cavity extends into the second portion of the tungsten;

depositing a first portion of polysilicon on the first portion of the tungsten and filling the cavity in the second portion of the tungsten with a second portion of polysilicon; and removing the first portion of the polysilicon and the first portion of the tungsten such that the second portion of tungsten is electrically isolated from the conductive contact.

5. The method of claim 4, further comprising removing material from a backside of the semiconductor substrate until the tungsten conductor and polysilicon at a bottom of the via opening are exposed.

6. The method of claim 4, wherein the conductive contact and the second portion of tungsten have coplanar upper surfaces after removing the first portion of tungsten.

\* \* \* \* \*

UNITED STATES PATENT AND TRADEMARK OFFICE
CERTIFICATE OF CORRECTION

| | | |
|---|---|---|
| PATENT NO. | : 8,753,981 B2 | Page 1 of 1 |
| APPLICATION NO. | : 13/092434 | |
| DATED | : June 17, 2014 | |
| INVENTOR(S) | : Kirby et al. | |

It is certified that error appears in the above-identified patent and that said Letters Patent is hereby corrected as shown below:

In the Claims

Column 8, line 55, Claim 1, delete "the" and insert -- the via --, therefor.

Signed and Sealed this
Nineteenth Day of August, 2014

Michelle K. Lee
*Deputy Director of the United States Patent and Trademark Office*